United States Patent
Kashitani et al.

(10) Patent No.: US 8,079,138 B2
(45) Date of Patent: Dec. 20, 2011

(54) MOUNTING APPARATUS FOR ELECTRONIC COMPONENTS

(75) Inventors: Hisayoshi Kashitani, Ota (JP); Kazuyoshi Ieizumi, Ota (JP)

(73) Assignee: Hitachi High-Tech Instruments Co., Ltd., Saitama (JP)

( * ) Notice: Subject to any disclaimer, the term of this patent is extended or adjusted under 35 U.S.C. 154(b) by 455 days.

(21) Appl. No.: 12/409,554

(22) Filed: Mar. 24, 2009

(65) Prior Publication Data

US 2009/0241327 A1   Oct. 1, 2009

(30) Foreign Application Priority Data

Mar. 25, 2008   (JP) .................................. 2008-078077

(51) Int. Cl.
 *H05K 13/04*   (2006.01)
(52) U.S. Cl. .............. 29/739; 700/117; 29/743; 29/741; 414/749.1; 414/752.1; 901/40
(58) Field of Classification Search .................. 700/117, 700/95; 29/739–743, 832–834, 836; 414/749.1, 414/752.1; 901/40
See application file for complete search history.

(56) References Cited

U.S. PATENT DOCUMENTS

| | | | | |
|---|---|---|---|---|
| 5,203,061 A * | 4/1993 | Hamada | ....................... | 29/33 M |
| 6,681,468 B1 * | 1/2004 | Uchiyama et al. | ......... | 29/407.01 |
| 6,789,310 B1 * | 9/2004 | Hata et al. | ....................... | 29/740 |
| 6,860,002 B2 * | 3/2005 | Oyama | ........................... | 29/740 |
| 6,968,610 B2 * | 11/2005 | Nagao et al. | .................... | 29/740 |
| 6,986,195 B2 * | 1/2006 | Seto et al. | ........................ | 29/740 |
| 7,581,310 B2 * | 9/2009 | Fukushima et al. | ............ | 29/743 |
| 7,841,073 B2 * | 11/2010 | Mitsumochi et al. | ........... | 29/743 |
| 7,966,718 B2 * | 6/2011 | Kodama et al. | ................. | 29/739 |
| 2002/0184755 A1 * | 12/2002 | Suhara | ............................ | 29/833 |
| 2003/0135991 A1 * | 7/2003 | Nagao et al. | .................... | 29/739 |
| 2005/0274004 A1 * | 12/2005 | Yoshii et al. | .................... | 29/743 |
| 2007/0011869 A1 * | 1/2007 | Watanabe et al. | ............... | 29/739 |
| 2008/0263857 A1 * | 10/2008 | Mitsumochi et al. | .......... | 29/743 |
| 2010/0050426 A1 * | 3/2010 | Shimizu et al. | ................. | 29/739 |
| 2011/0030203 A1 * | 2/2011 | Mitsumochi et al. | ........... | 29/739 |

FOREIGN PATENT DOCUMENTS

| | | |
|---|---|---|
| EP | 0 808 091 | 11/1997 |
| EP | 1 185 156 | 3/2002 |
| JP | 2004-047818 | 2/2004 |
| JP | 2006-286707 | 10/2006 |
| WO | WO 2007/021026 | 2/2007 |

* cited by examiner

*Primary Examiner* — Derris Banks
*Assistant Examiner* — Kaying Kue
(74) *Attorney, Agent, or Firm* — Antonelli, Terry, Stout & Kraus, LLP.

(57) ABSTRACT

In a mounting apparatus for electronic components, a command from a host computer is transmitted to a linear motor M via a motion controller and a servo amplifier to thereby drive a mounting head H1 or a mounting head H2. To prevent collision between the two mounting heads H1, H2, position information from a linear encoder E is fed back to not only the servo amplifier, but also the motion controller. Once determining that the two mounting heads H1, H2 collide, the motion controller applies brake to the mounting heads H1, H2 to avoid collision therebetween, regardless of the command from the host computer.

8 Claims, 13 Drawing Sheets

MOUNTING APPARATUS FOR ELECTRONIC COMPONENTS

CLAIM OF PRIORITY

The present application claims priority from Japanese Patent Application JP 2008-078077 filed on Mar. 25, 2008, the content of which is hereby incorporated by reference into this application.

BACKGROUND OF THE INVENTION

1. Field of the Invention

The present invention relates to an electronic component mounting apparatus that picks up an electronic component from an electronic component supply device and mounts the electronic component on a printed board.

2. Description of the Related Art

To respond to a wider range of functions required of electronic devices, the number of electronic components required is on the increase. These electronic components are mounted on printed boards and then incorporated into the electronic device. The ability of the mounting apparatus to mount how many components and how many different types of components on a printed board within a predetermined period of time greatly affects the cost of the electronic device.

JP-A-2006-286707 discloses an apparatus that picks up an electronic component through suction using a mounting head having a plurality of nozzles from a component supply device and mounts the electronic component on a printed board. The mounting head is mounted on a movable element disposed on a beam that extends in an x-direction (hereinafter referred to as the "x-beam"), the movable element being capable of moving in the x-direction. The x-beam is mounted on a movable element disposed on a beam that extends in a y-direction (hereinafter referred to as the "y-beam"), the movable element being capable of moving in the y-direction. Each of these movable elements is moved by a linear motor or a pulse motor to a desired position based on a command issued from a host computer and picks up or mounts a component.

JP-A-2006-286707 also describes that the component supply device is disposed on each of both sides of the printed board and, to respond to this arrangement, the component mounting head is also mounted on each of both sides of the printed board for the increased component mounting speed. JP-A-2006-286707 further describes that, to prevent reduction in production efficiency when a specific type of component is used frequently, components having a high use frequency are disposed dispersedly in the component supply device.

JP-A-2004-47818 discloses an arrangement, in which a plurality of heads is disposed on the x-beam to thereby increase the speed at which the electronic component is picked up from the electronic component supply device and the electronic component is mounted on the printed board.

SUMMARY OF THE INVENTION

JP-A-2006-286707 discloses a technique, in which the total component mounting time is shortened by disposing the components having a high use frequency dispersedly in the component supply device. In this case, each of the mounting heads disposed on either side of the printed board mounts electronic components only on one side of the printed board. Specifically, each mounting head picks up electronic components from the component supply device disposed on one side of the electronic component mounting apparatus and mounts the electronic components on only one side of the printed board. The electronic components are thereby mounted on the entire surface of the printed board by the two mounting heads disposed mutually opposite directions.

In such an arrangement, each of the two mounting heads mounts components only on either side of the printed board and there is therefore no likelihood that the mounting heads will collide. In this case, however, each mounting head accesses the component supply device on one side only and mounts electronic components on only one side of the printed board, and thus has a restricted degree of freedom. An arrangement is therefore conceivable, in which each of the two mounting heads accesses not only the one of the component supply devices, but also the other of the component supply devices, to pick up electronic components and mounts the electronic components on the other printed board. In this case, however, the two mounting heads may interfere with each other and collide.

A program previously written in the host computer defines the pickup of components from the component supply device and mounting of the component on the printed board as performed by the mounting head. Collision can therefore be avoided as long as the program runs properly. The electronic component mounting apparatus nonetheless needs to respond to a large variety of printed boards, which requires that a specific program be used for each of different types of printed boards. Modifying the program very often involves a program bug in many cases.

If a program bug occurs, there is likelihood that the two mounting heads will collide. To increase component mounting speed, the mounting head moves at high speeds of about 2 m/sec. If the mounting heads moving at such high speeds collide, the heads break. The mounting head is mounted with parts, for example, a large number of nozzles for picking up components, a mechanism for controlling the nozzles, and a camera for recognizing the printed board. Damage can be serious if these parts are broken by the collision. In addition, if the mounting head is broken, the electronic component mounting apparatus does not operate until recovery, significantly degrading productivity.

In the technique disclosed in JP-A-2004-47818, the component supply device is disposed on only one side of the printed board and the mounting speed is increased by mounting a plurality of heads on the x-beam. This arrangement, however, often makes it difficult to provide an ample space for component supply. There is also a danger of collision of the plurality of heads disposed on the x-beam. The likelihood of collision is particularly great during maintenance and the problems caused by the collision are the same as those described with reference to the arrangement disclosed in JP-A-2006-286707.

It is an object of the present invention to provide, in an electronic component mounting apparatus having two mounting heads, each being capable of picking up electronic components from either one of two component supply devices and mounting electronic components in overlapping areas of a printed board, a system that avoids collision of the two mounting heads in reality even if a host computer issues a command to allow the two mounting heads to collide because of a program bug.

Having a greater distance between the mounting heads should be even safer in order to avoid collision; however, the greater distance between two mounting heads for avoiding collision results in a limited movable range of each mounting head, leading to a reduced mounting speed. It is therefore another object of the present invention to provide as much a movable range as possible for each mounting head, while avoiding collision of the mounting heads.

The present invention has been made to solve the foregoing problems with the following specific arrangements.

(1) In accordance with a first aspect of the present invention, there is provided a mounting apparatus for electronic components. The mounting apparatus includes: a transport unit for transporting a printed board in a first direction; a component supply device disposed on an outside in a second direction that is perpendicular to the first direction relative to the transport unit; a first y-beam and a second y-beam that extend in the second direction, the first and second y-beams being spaced apart from each other; a first x-beam and a second x-beam that extend in the first direction so as to bridge between the first y-beam and the second y-beam; a first mounting head disposed on the first x-beam and a second mounting head disposed on the second x-beam, the first mounting head and the second mounting head for mounting electronic components from the component supply device on the printed board; a first encoder disposed on the first y-beam or the second y-beam and the first x-beam, the first encoder for detecting the position of the first mounting head; and a second encoder disposed on the first y-beam or the second y-beam and the second x-beam, the second encoder for detecting the position of the second mounting head. In the mounting apparatus, the first mounting head moves based on a command inputted to a first servo amplifier from a host computer via a first motion controller; the second mounting head moves based on a command inputted to a second servo amplifier from the host computer via a second motion controller; the position information from the first encoder is fed back to the first servo amplifier and the first motion controller; and the position information from the second encoder is fed back to the second servo amplifier and the second motion controller.

(2) In accordance with a second aspect of the present invention, there is provided the mounting apparatus for electronic components according to the first aspect of the present invention, in which the first motion controller has a function to calculate speed information and acceleration information of the first mounting head based on the position information from the first encoder; and the second motion controller has a function to calculate speed information and acceleration information of the second mounting head based on the position information from the second encoder.

(3) In accordance with a third aspect of the present invention, there is provided the mounting apparatus for electronic components according to the first aspect of the present invention, in which the first motion controller has a function to operate the first mounting head preferentially over the command from the host computer based on the information from the first encoder; and the second motion controller has a function to operate the second mounting head preferentially over the command from the host computer based on the information from the second encoder.

(4) In accordance with a fourth aspect of the present invention, there is provided the mounting apparatus for electronic components according to the third aspect of the present invention, in which the above-referenced operations intend to avoid collision between the first mounting head and the second mounting head.

(5) In accordance with a fifth aspect of the present invention, there is provided a mounting apparatus for electronic components. The mounting apparatus includes: a transport unit for transporting a printed board in a first direction; a component supply device disposed on an outside in a second direction that is perpendicular to the first direction relative to the transport unit; a first y-beam and a second y-beam that extend in the second direction, the first and second y-beams being spaced apart from each other; a first x-beam and a second x-beam that extend in the first direction so as to bridge between the first y-beam and the second y-beam; a first mounting head disposed on the first x-beam and a second mounting head disposed on the second x-beam, the first mounting head and the second mounting head for mounting electronic components from the component supply device on the printed board; a first encoder disposed on the first y-beam or the second y-beam and the first x-beam, the first encoder for detecting the position of the first mounting head; and a second encoder disposed on the first y-beam or the second y-beam and the second x-beam, the second encoder for detecting the position of the second mounting head. In the mounting apparatus, the first mounting head moves based on a command inputted to a first servo amplifier from a host computer via a first motion controller; the second mounting head moves based on a command inputted to a second servo amplifier from the host computer via a second motion controller; the position information from the first encoder is fed back to the first servo amplifier and the first motion controller; the position information from the second encoder is fed back to the second servo amplifier and the second motion controller; the first motion controller calculates speed information and acceleration information of the first mounting head based on the position information from the first encoder; the second motion controller calculates speed information and acceleration information of the second mounting head based on the position information from the second encoder; and the first motion controller and the second motion controller share the position information, the speed information, and the acceleration information of the first mounting head and the position information, the speed information, and the acceleration information of the second mounting head.

(6) In accordance with a sixth aspect of the present invention, there is provided the mounting apparatus for electronic components according to the fifth aspect of the present invention, in which the first motion controller and the second motion controller operate the first mounting head or the second mounting head preferentially over the command from the host computer based on the position information or the speed information or the acceleration information of the first mounting head and the position information or the speed information or the acceleration information of the second mounting head.

(7) In accordance with a seventh aspect of the present invention, there is provided the mounting apparatus for electronic components according to the fifth aspect of the present invention, in which the operation of the first mounting head or the second mounting head is to avoid collision between the first mounting head and the second mounting head.

(8) In accordance with an eighth aspect of the present invention, there is provided the mounting apparatus for electronic components according to the fifth aspect of the present invention, in which the first motion controller and the second motion controller are electrically connected with each other.

(9) In accordance with a ninth aspect of the present invention, there is provided a mounting apparatus for electronic components. The mounting apparatus includes: a transport unit for transporting a printed board in a first direction; a component supply device disposed on an outside in a second direction that is perpendicular to the first direction relative to the transport unit; a first y-beam and a second y-beam that extend in the second direction, the first and second y-beams being spaced apart from each other; a first x-beam and a second x-beam that extend in the first direction so as to bridge between the first y-beam and the second y-beam; a first mounting head disposed on the first x-beam and a second mounting head disposed on the second x-beam, the first mounting head and the second mounting head for mounting electronic components from the component supply device on the printed board; a first encoder disposed on the first y-beam or the second y-beam and the first x-beam, the first encoder for detecting the position of the first mounting head; and a second encoder disposed on the first y-beam or the second y-beam and the second x-beam, the second encoder for detecting the position of the second mounting head. In the mounting apparatus, the first mounting head moves based on a command inputted to a first servo amplifier from a host computer via a first motion controller; the second mounting head moves based on a command inputted to a second servo amplifier from the host computer via a second motion controller; the position information from the first encoder is fed back to the first servo amplifier and the first motion controller; the position information from the second encoder is fed back to the second servo amplifier and the second motion controller; and the first or the second motion controller determines which mounting head, the first or the second, is faster than the other, and establishes an operating condition for the faster mounting head based on the command given to the mounting head and for the slower mounting head based on the position information from the corresponding encoder.

(10) In accordance with a tenth aspect of the present invention, there is provided the mounting apparatus for electronic components according to the ninth aspect of the present invention, in which the slower mounting head remains stationary.

(11) In accordance with an eleventh aspect of the present invention, there is provided the mounting apparatus for electronic components according to the ninth aspect of the present invention, in which the faster mounting head and the slower mounting head move substantially in the same direction.

(12) In accordance with a twelfth aspect of the present invention, there is provided a mounting apparatus for electronic components. The mounting apparatus includes: a transport unit for transporting a printed board in a first direction; a component supply device disposed on an outside in a second direction that is perpendicular to the first direction relative to the transport unit; a y-beam that extends in the second direction, and a first x-beam and a second x-beam disposed on the y-beam, the first and the second x-beams extending in the first direction; a first mounting head disposed on the first x-beam and a second mounting head disposed on the second x-beam, the first mounting head and the second mounting head for mounting electronic components from the component supply device on the printed board; a first encoder disposed on the y-beam and the first x-beam, the first encoder for detecting the position of the first mounting head; and a second encoder disposed on the y-beam and the second x-beam, the second encoder for detecting the position of the second mounting head. In the mounting apparatus, the first mounting head moves based on a command inputted to a first servo amplifier from a host computer via a first motion controller; the second mounting head moves based on a command inputted to a second servo amplifier from the host computer via a second motion controller; the position information from the first encoder is fed back to the first servo amplifier and the first motion controller; the position information from the second encoder is fed back to the second servo amplifier and the second motion controller; the first motion controller calculates speed information and acceleration information of the first mounting head based on the position information from the first encoder; the second motion controller calculates speed information and acceleration information of the second mounting head based on the position information from the second encoder; and the first motion controller and the second motion controller share the position information, the speed information, and the acceleration information of the first mounting head and the position information, the speed information, and the acceleration information of the second mounting head.

In accordance with the aspects of the present invention, the two mounting heads of the mounting apparatus for electronic components can pick up electronic components from either one of the component supply devices disposed on both sides of the mounting apparatus for electronic components and mount the electronic components on the printed board regardless of the mounting area in the printed board. The speed of mounting electronic components on the printed board can therefore be increased.

For a likelihood of collision between the two mounting heads as a result of the two mounting heads operating in an overlapping area, the two motion controllers identify at all times the position information, the speed information, and the acceleration information of the two mounting heads; should the likelihood of collision arise, commands are issued from the motion controllers to the mounting heads preferentially over the command from the host computer, so that the collision can be avoided.

With the mechanism for avoiding collision between the two mounting heads, the spacing between the two mounting heads can be set to the smallest distance possible for avoiding the collision. This increases the degree of freedom of movement of each mounting head and the mounting speed of the electronic components.

BRIEF DESCRIPTION OF THE DRAWINGS

The present invention will be described hereinafter with reference to the accompanying drawings.

DETAILED DESCRIPTION OF THE PREFERRED EMBODIMENTS

Figure 1:
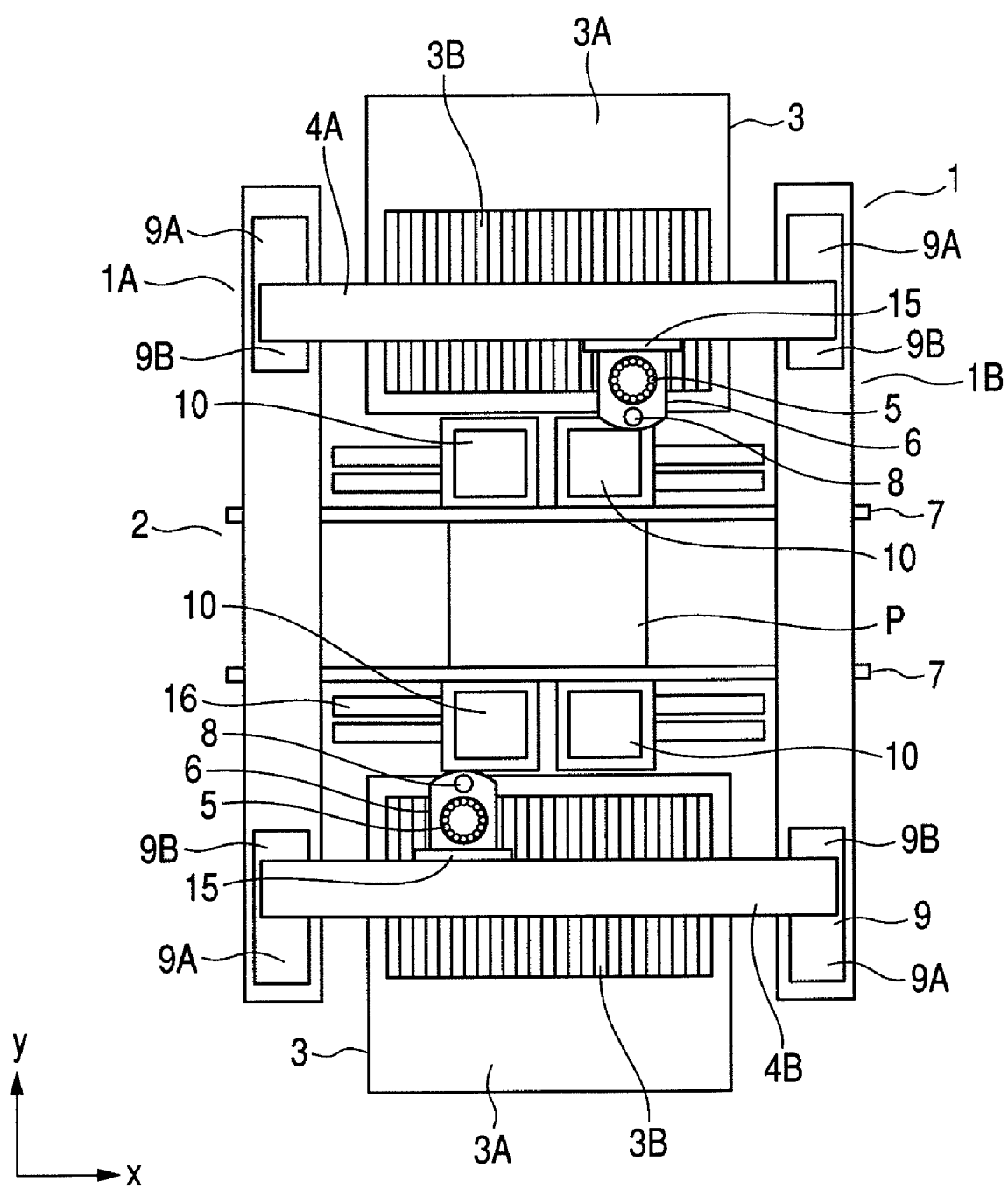
FIG. 1 is a plan view showing an electronic component mounting apparatus according to an embodiment of the present invention.

FIG. 1 is a plan view showing an electronic component mounting apparatus 1 according to an embodiment of the present invention. Referring to FIG. 1, a printed board P is placed on a rail-like printed board conveyor 7, supplied from the left direction in FIG. 1 to the electronic component mounting apparatus 1, and positioned at a central portion of the electronic component mounting apparatus 1. A printed board transport unit 2 includes the printed board conveyor 7, a drive section, and a positioning section. When mounting of electronic components on the printed board P is completed, the printed board P is fed out in the right direction in FIG. 1.

Two electronic component mounting apparatuses 1 shown in FIG. 1 may in some cases be disposed in parallel with each other, so that mounting of the electronic components on the printed board P is completed by two or more electronic component mounting apparatuses 1. In this case, a first electronic component mounting apparatus mounts, for example, half of the electronic components on the printed board P and the printed board P is thereafter moved in the right direction of FIG. 1 on the printed board conveyor 7. The printed board P is transported onto, and set up in, a second electronic component mounting apparatus disposed downstream of the first electronic component mounting apparatus and then mounted with the rest of electronic components in the same manner as with the first electronic component mounting apparatus.

Referring to FIG. 1, a component supply device 3 is disposed on each of the upper and lower sides in FIG. 1 of the electronic component mounting apparatus 1. The component supply device 3 includes a feeder base 3A and a component feeding unit 3B. The feeder base 3A is attached to a main body of the electronic component mounting apparatus 1. The component feeding unit 3B includes a large plurality of tapes in which electronic components are set up. When a suction nozzle 5 of a mounting head 6 picks up an electronic component set up in the tape, the tape is fed and the next electronic component can be picked up.

Y-beams 1A, 1B extending in the y-direction are formed on both sides of the electronic component mounting apparatus 1. A y-movable element 9 is mounted on each of the left and right y-beams 1A, 1B. Note herein that a stator is mounted on each of the y-beam 1A and the y-beam 1B, so that the stator and the y-movable element 9 constitute a linear motor. Accordingly, the linear motor lets the y-movable element 9 move freely along the y-beam 1A, 1B in the y-direction. Each of x-beams 4A, 4B extending in the x-direction has an end portion fitted to each of the left and right y-movable elements 9. Each of the x-beams 4A, 4B includes an x-movable element 15 mounted thereon. A stator is mounted on each of the x-beam 4A and the x-beam 4B, so that the stator and the x-movable element 15 constitute a linear motor. Accordingly, the linear motor lets the x-movable element 15 move freely along the x-beam 4A, 4B. The x-movable element 15 is mounted with the mounting head 6.

The y-movable element 9 is moved along the y-beam 1A, 1B by the linear motor based on a command from a host computer. Similarly, the x-movable element 15 is moved along the x-beam 4A, 4B by the linear motor based on a command from the host computer. Each of the y-movable element 9 and the x-movable element 15 includes a linear encoder mounted thereon, so that position information of each movable element can be fed back to a servo system.

Figure 10:
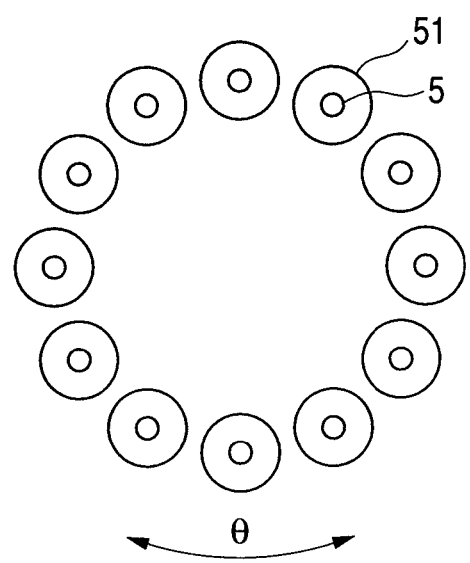
FIG. 10 shows the layout of nozzles of the mounting head.

The mounting head 6 includes the suction nozzles 5 for picking up components. The suction nozzles 5 are disposed circumferentially. In accordance with the embodiment of the present invention, twelve suction nozzles 5 are disposed circumferentially as shown in FIG. 10. These suction nozzles 5 are moved circumferentially by a nozzle rotation motor 52 and an intended electronic component is picked up by a corresponding suction nozzle.

The mounting head 6 also includes a board recognition camera 8. The board recognition camera 8 recognizes a fiducial point on the printed board P when the mounting head 6 later moves over to a point above the printed board P. The fiducial point serves as a reference point for defining a specific position of the electronic component to be mounted on the printed board P. These parts of the mounting head 6 are covered in a head cover 12. Though not shown in FIG. 1, a bumper 11 to be described later is disposed on the outside of the head cover 12.

FIG. 1 shows a condition, in which the two mounting heads 6 pick up electronic components from the component feeding unit 3B on the upper side in FIG. 1 and the component feeding unit 3B on the lower side in FIG. 1, respectively. In this condition, the mounting head 6 can pick up a total of twelve electronic components by rotating the suction nozzles 5.

A component recognition camera 10 is disposed between the component supply device 3 and the printed board P. The component recognition camera 10 has its imaging section at the underside of the component feeding unit, recognizing the condition of the electronic components picked up by the suction nozzle 5. The component recognition camera 10 can recognize the condition of the electronic components picked up by the 12 suction nozzles 5 all at once. A mounting failure results if an attempt is made to mount an electronic component in a faultily picked up condition on the printed board P. When, therefore, a component pickup failure is found by the component recognition camera 10, the faulty component is dropped down into an ejection box 16. The ejection box 16 is disposed beside the component recognition camera 10. Two each component recognition cameras 10 are disposed on either side of the printed board P. This arrangement is to ensure a quick recognition of the picked up condition of the electronic component.

Referring to FIG. 1, the y-movable element 9 is an integral body; however, when the y-movable element 9 is divided into two parts of an inner movable element 9B and an outer movable element 9A, then the inner movable element 9B is shorter than the outer movable element 9A. This arrangement is to prevent the y-movable element 9 from becoming a stopper when the two mounting heads 6 pick up components from the same component supply device 3 or when the two mounting heads 6 mount electronic components on an area of the printed board P overlapping in the y-direction. The arrangement of preventing the y-movable element 9 from becoming a stopper, on the other hand, gives rise to the likelihood of possible collision between the two mounting heads 6. The object of the present invention is to avoid collision of the two mounting heads 6 reliably by setting a collision avoidance mechanism to be described later.

Figure 19:
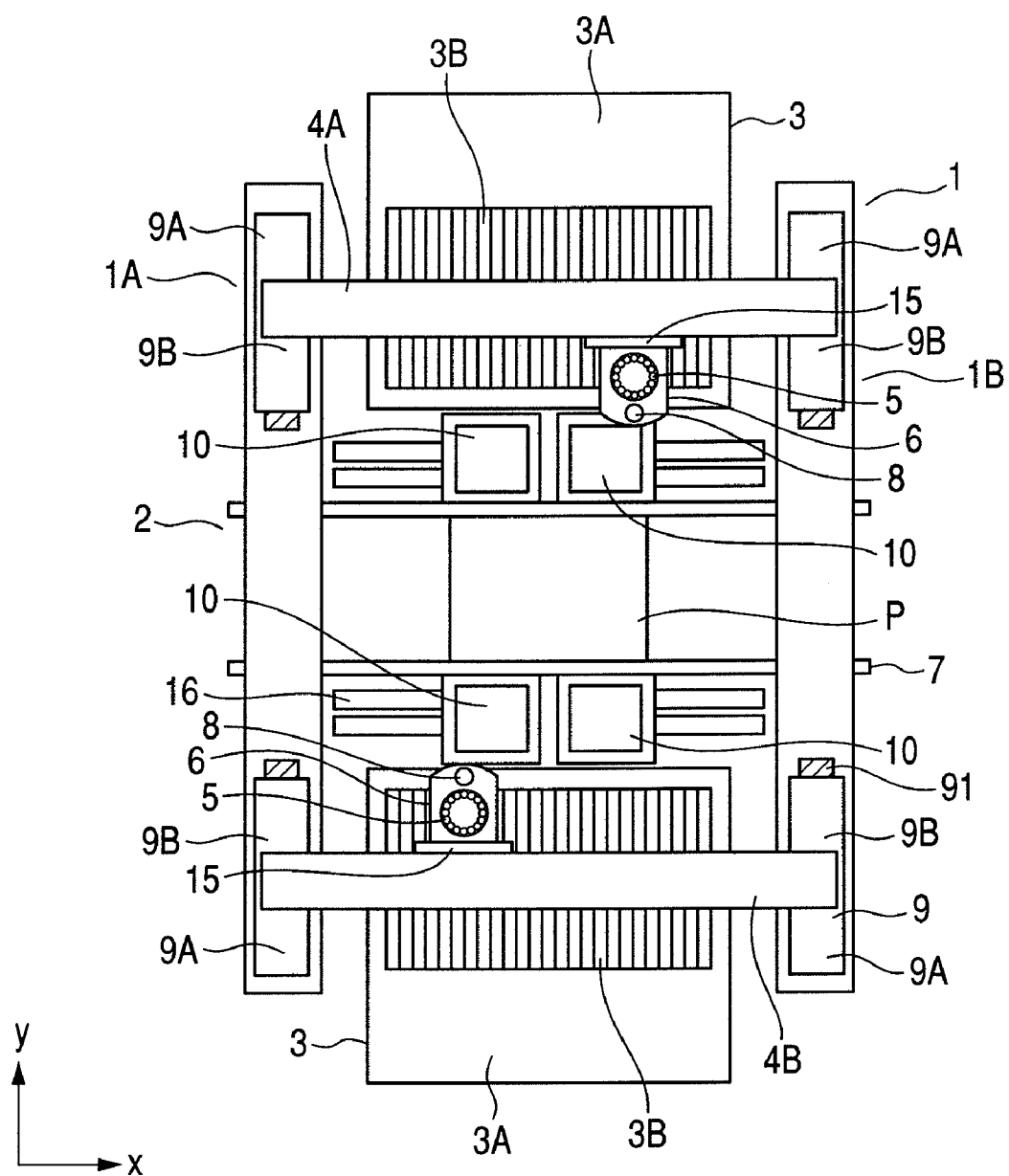
FIG. 19 is a plan view showing an electronic component mounting apparatus according to a prior art, in which two mounting heads pick up electronic components from component supply devices.

FIG. 19 is a plan view showing a prior-art electronic component mounting apparatus 1. Comparing the arrangement shown in FIG. 19 with that shown in FIG. 1, it is known that an outer movable element 9A and an inner movable element 9B of a y-movable element 9 disposed on y-beams 1A, 1B are of substantially the same length. In addition, the inner movable element 9B includes a stopper 91 disposed at a leading end thereof. The stopper 91 has a leading end that is flush with, or protrudes from, a leading end of a mounting head 6. The stopper 91 eliminates the possibility of the mounting heads 6 on the upper and lower sides of FIG. 19 colliding. In the arrangement shown in FIG. 19, however, the mounting head 6 on the lower side of FIG. 19, for example, is unable to pick up electronic components from a component supply device 3 on the upper side of FIG. 19 because of the stopper 91.

Figure 2:
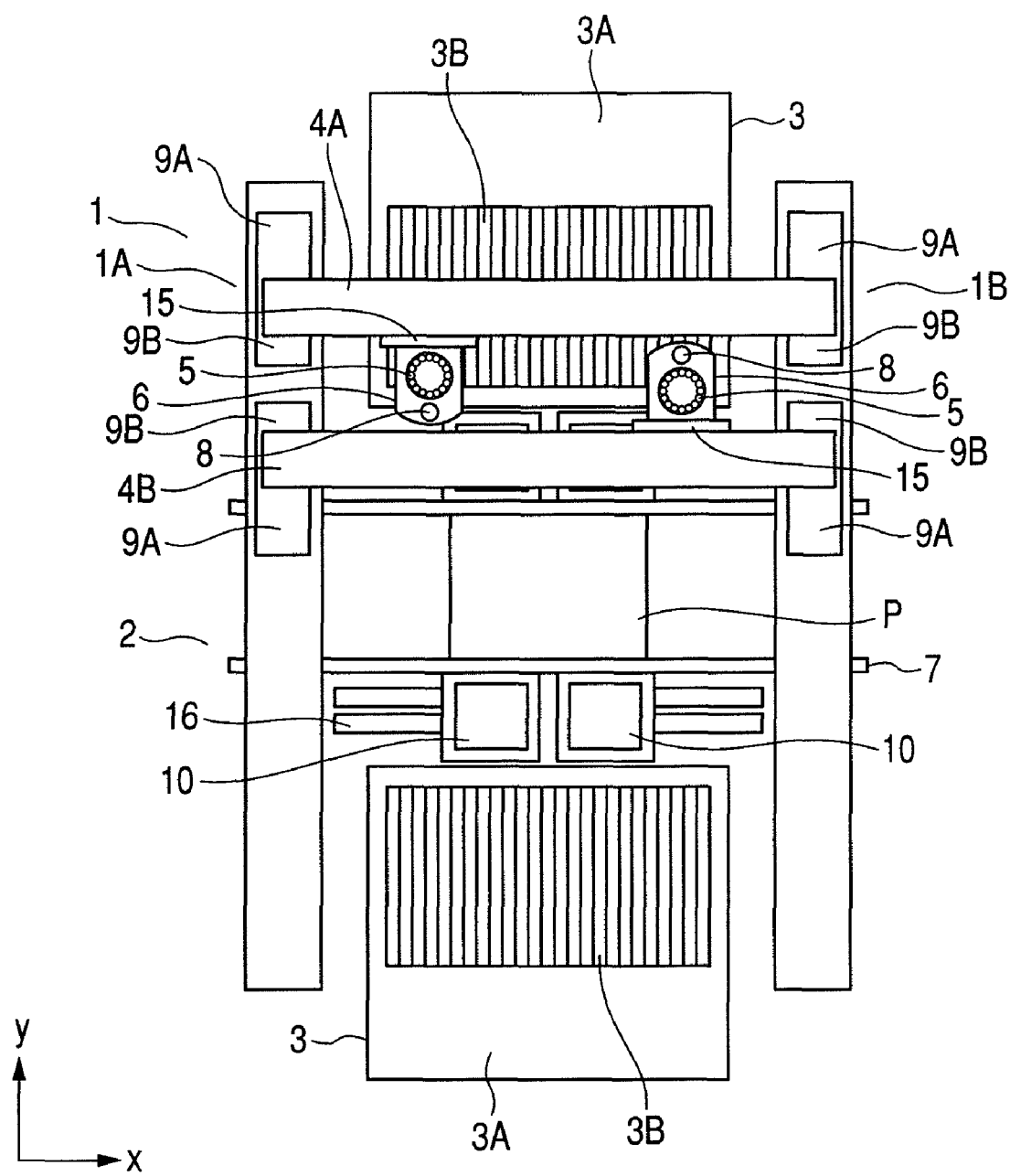
FIG. 2 is a plan view showing the electronic component mounting apparatus according to the embodiment of the present invention, in which two mounting heads pick up electronic components from the same component supply device.

FIG. 2 is a plan view showing the electronic component mounting apparatus 1 according to the embodiment of the present invention, in which the mounting heads 6 pick up electronic components from the component feeding unit 3B of the component supply device 3 on the upper side of FIG. 2. Specifically, the x-beam 4B on the lower side of FIG. 2 mounted on the y-movable element 9 moves along the y-beams 1A, 1B and the mounting head 6 on the lower side of FIG. 2 moves to a point above the component feeding unit 3B on the upper side of FIG. 2. Accordingly, in FIG. 2, the two mounting heads 6 pick up electronic components from the component feeding unit 3B on the upper side of FIG. 2. As described earlier with reference to FIG. 1, the inner movable element 9B of the y-movable element 9 does not serve as a stopper, which allows such interference between the two mounting heads 6 to occur. This results in an increased degree of freedom in mounting of electronic components. In FIG. 2, on the other hand, the mounting heads 6 overlap each other in the y-direction, so that a movement of the mounting heads 6 in the x-direction involves danger of collision of the two mounting heads 6.

Figure 3:
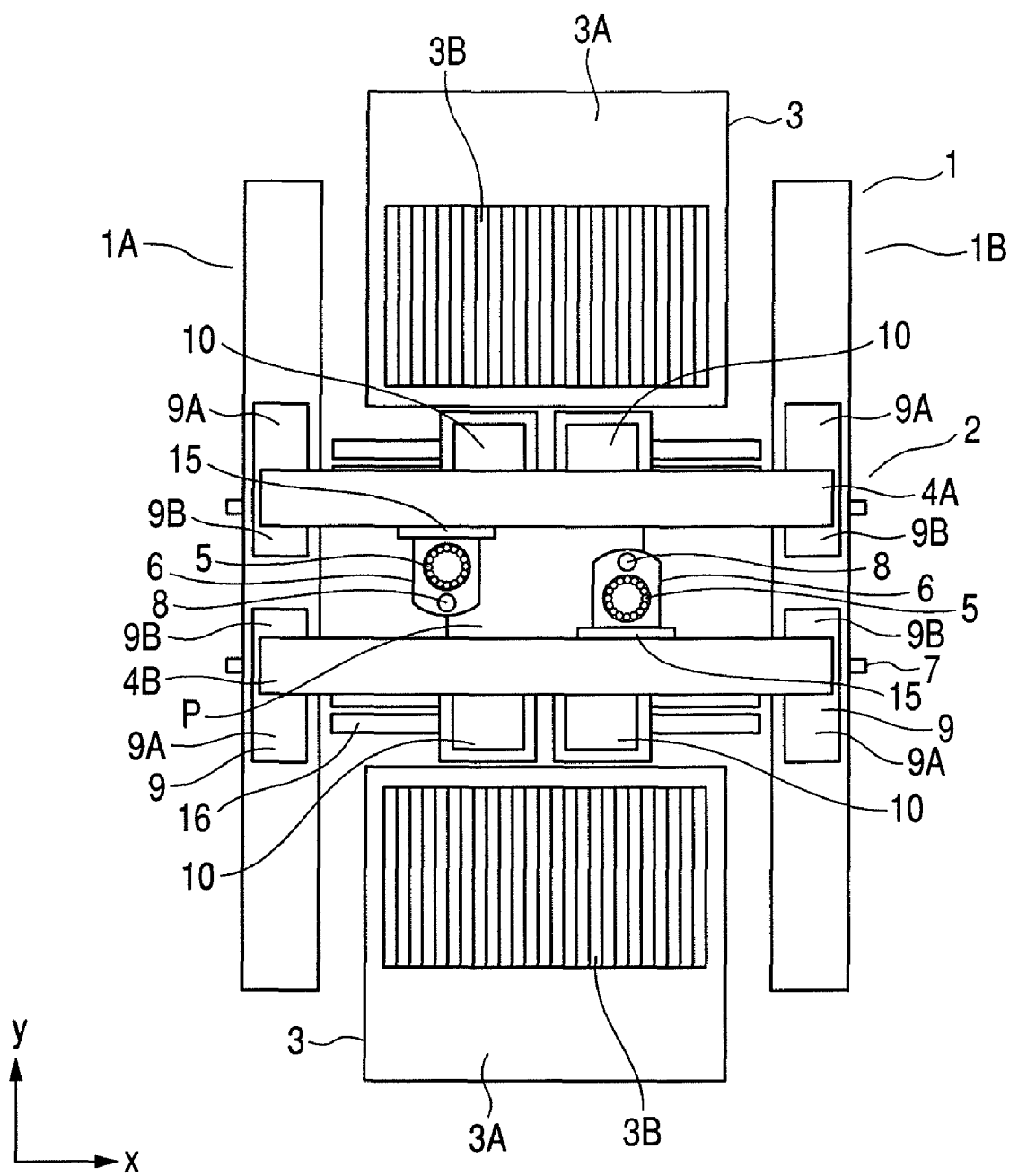
FIG. 3 is a plan view showing the electronic component mounting apparatus according to the embodiment of the present invention, in which two mounting heads mount electronic components on a printed board.

FIG. 3 is a plan view showing a condition, in which two mounting heads 6 mount electronic components on the printed board P after having picked up the electronic components from the component feeding unit 3B on the upper side of FIG. 3. In FIG. 3, the two mounting heads 6 are spaced apart from each other in the x-direction, but overlap each other in the y-direction. This is made possible by the inner movable element 9B of the y-movable element 9 not serving as a stopper. As such, the two mounting heads 6 mount the electronic components in areas that overlap each other in the y-direction relative to the printed board P, which enhances the degree of freedom in mounting. This offers an advantage of the increased mounting speed of electronic components on the printed board P, particularly when a greater number of electronic components need to be mounted on one side of the printed board P than the other side.

Figure 20:
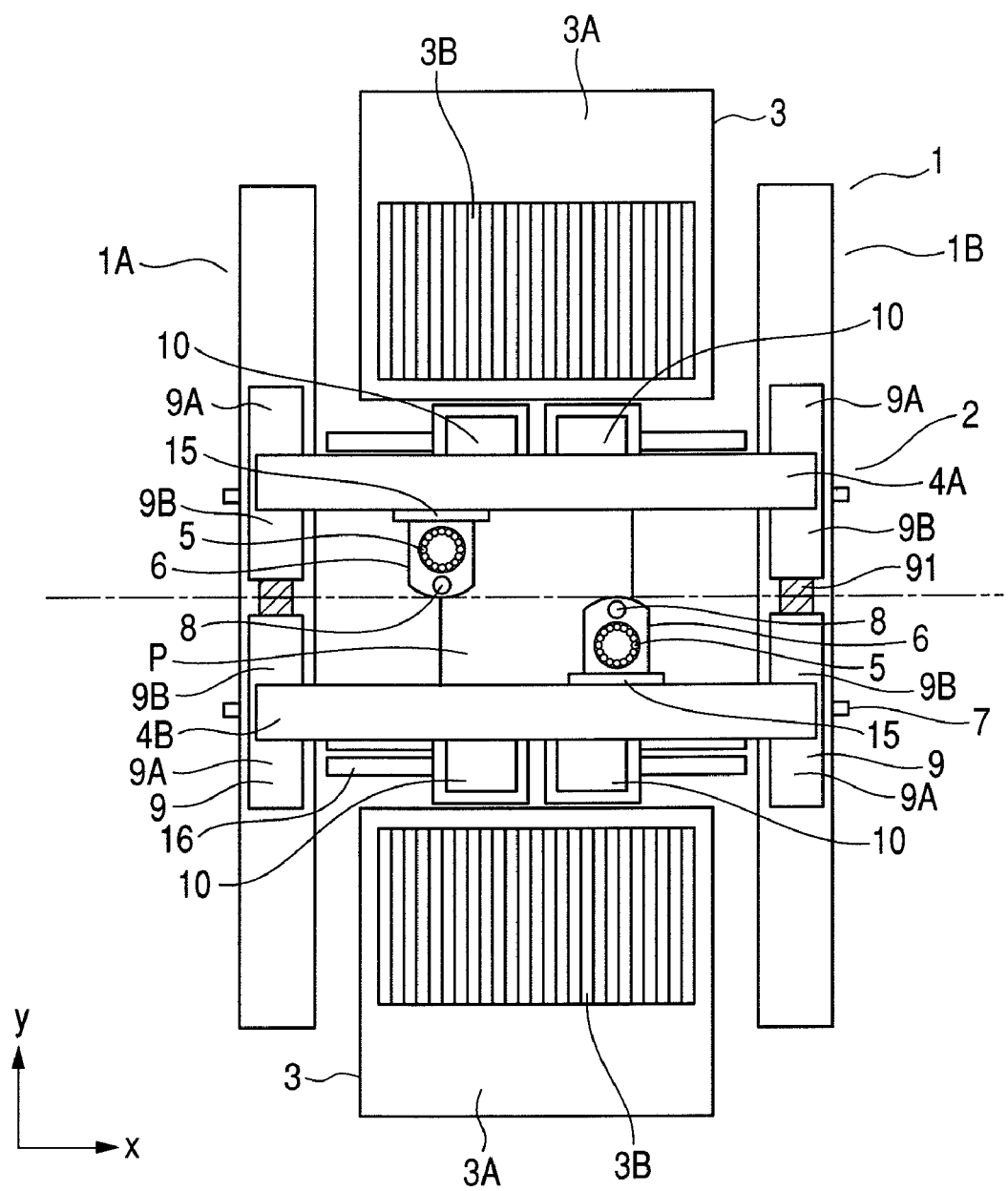
FIG. 20 is a plan view showing the electronic component mounting apparatus according to the prior art, in which the two mounting heads mount electronic components on a printed board.

FIG. 20 is a plan view showing the prior-art electronic component mounting apparatus, in which electronic components are mounted on the printed board P. FIG. 20 shows a condition, in which the mounting heads 6, both on the upper and lower sides of FIG. 20, mount the electronic components on the printed board P. In FIG. 20, the mounting head 6 on the upper side of FIG. 20 mounts the electronic components on only an upper side of the printed board P, while the mounting head 6 on the lower side of FIG. 20 mounts the electronic components on only a lower side of the printed board P.

In addition, the electronic component mounting apparatus shown in FIG. 20 is structured such that the mounting head 6 on the upper side of FIG. 20 is unable to pick up the electronic components from the component feeding unit 3B on the lower side of FIG. 20. Accordingly, in the electronic component mounting apparatus shown in FIG. 20, operations on the upper side and lower side of the printed board P are independent of each other. Specifically, when there is a significant difference in the number of electronic components to be mounted between the upper and lower sides of the printed board P in FIG. 20, there is a difference in operating time between the upper and lower sides of the printed board P. Specifically, even when the mounting operation is completed on one side of the printed board P, the mounting operation on the other side of the printed board P needs to continue until mounting of the greater number of electronic components to be mounted on the printed board P is completed. This results in time loss.

In the electronic component mounting apparatus shown in FIG. 20, on the other hand, the mounting head 6 on the upper side of FIG. 20 does not enter the lower side beyond a centerline of the printed board P and the mounting head 6 on the lower side of FIG. 20 does not enter the upper side beyond the centerline of the printed board P. Further, the inner movable element 9B of the y-movable element 9 includes the stopper 91 disposed at the leading end thereof. Consequently, there is no likelihood that the mounting head 6 on the upper side of FIG. 20 will collide with the mounting head 6 on the lower side of FIG. 20.

Referring to FIGS. 1, 2, 3, and others, the x-beams 4A, 4B are supported by the two y-beams 1A, 1B. Each of the x-beams 4A, 4B is not, however, necessarily supported by the two y-beams 1A, 1B; strength of the x-beams 4A, 4B permitting, each of the x-beams 4A, 4B may be supported by only either one of the y-beams 1A, 1B. For example, the x-beam 4A may be supported by the y-beam 1A only and the x-beam 4B may be supported by the y-beam 1B only. As described heretofore, the electronic component mounting apparatus, in which the present invention is embodied, permits mounting of the electronic components on the printed board at higher speed than the prior-art electronic component mounting apparatus, entailing, however, the likelihood of collision between the mounting heads. An object of the present invention is to provide as much a movable range as possible for each mounting head, while avoiding collision of the mounting heads.

Figure 4:
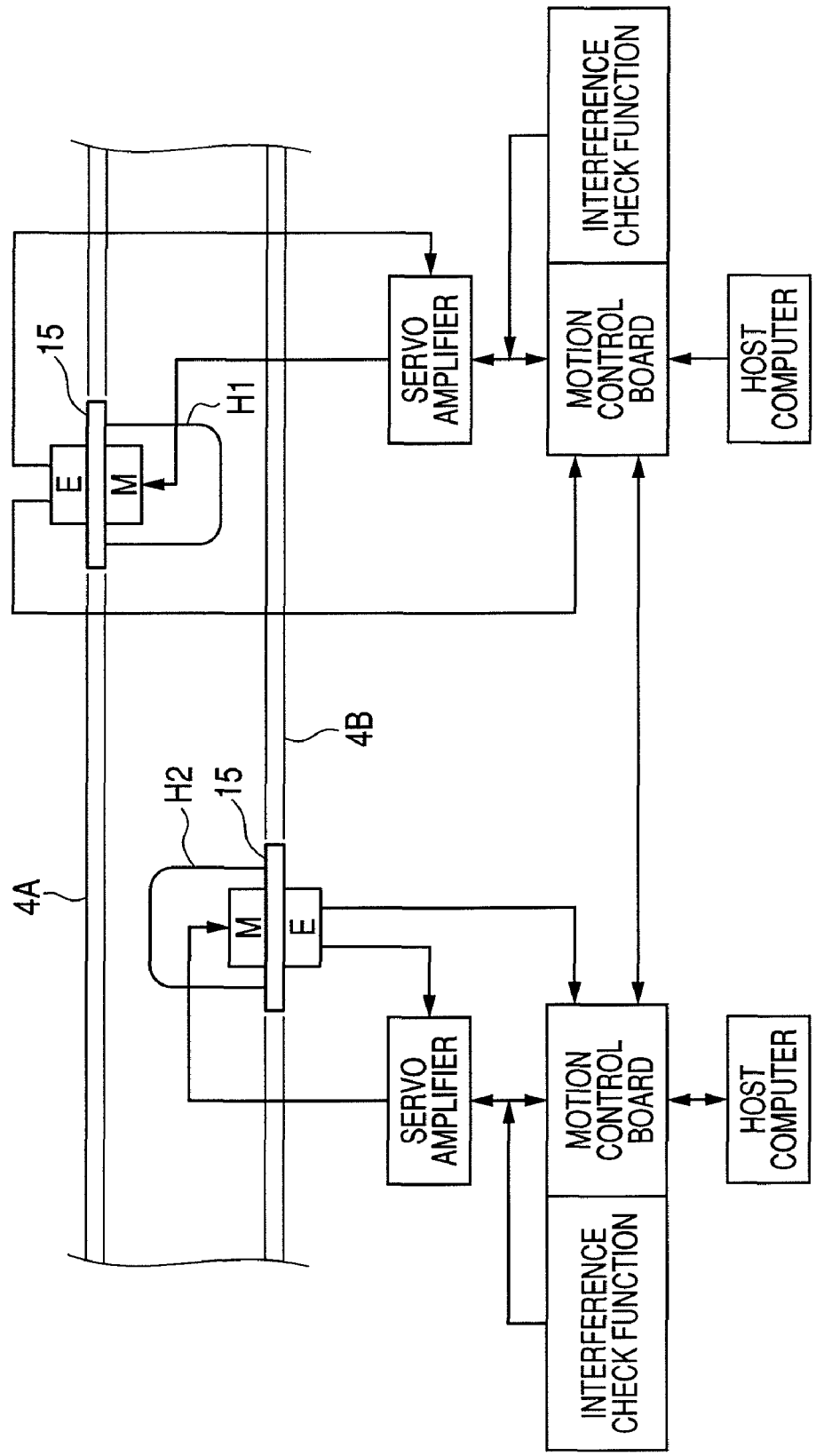
FIG. 4 is a block diagram showing schematically a control system for the electronic component mounting apparatus according to the embodiment of the present invention.

FIG. 4 is a block diagram showing schematically the arrangement of the electronic component mounting apparatus according to the embodiment of the present invention. In the following descriptions to be made with reference to FIGS. 4, 7, 8, 14, 17, and others, the two mounting heads will be referred to as a first head H1 and a second head H2 for convenience sake. Referring to FIG. 4, the first head H1 is mounted on the x-beam 4A on the upper side of FIG. 4 via the x-movable element 15. The x-movable element 15 is mounted with a linear motor M and a linear encoder E. The linear motor M moves the movable element and the mounting head 6 along the x-beam. The linear encoder E detects the position of the mounting head 6. Similarly, the x-movable element 15, a linear motor M, a linear encoder E, and the mounting head 6 are mounted on the x-beam 4B on the lower side of FIG. 4.

The y-movable element 9 shown in FIG. 1 is also mounted with a linear motor M and a linear encoder E, though not shown. This linear motor M moves the x-beam along the y-beam. The linear encoder E detects the position of the x-beam on the y-beam. The term "linear encoder E" will hereinafter refer to both the linear encoder E mounted on the x-movable element 15 and the linear encoder E mounted on the y-movable element 9. The term "position information from the linear encoder E" will hereinafter refer to the position information from both the linear encoder E mounted on the x-movable element 15 and the linear encoder E mounted on the y-movable element 9.

Movement of the second head H2 disposed on the x-beam 4B on the lower side of FIG. 4 will be described below with reference to FIG. 4. In accordance with the program incorporated in the host computer, the host computer issues a command to a motion controller for moving the mounting head 6. The host computer outputs information on a target position of the mounting head 6, a speed for arriving at the target position, and acceleration for reaching the set speed. The motion controller sends this command to a servo amplifier. The servo amplifier sends this command to the linear motor M. The linear motor M moves the x-movable element 15 and the mounting head 6 to a predetermined position.

The linear encoder E mounted on the x-movable element 15 provides the servo amplifier with positional feedback information and the servo amplifier positions the mounting head 6 accurately at the predetermined position. The first head H1 disposed on the x-beam 4A on the upper side of FIG. 4 operates similarly.

The embodiment of the present invention is characterized in that the position information from the linear encoder E is fed back to not only the servo amplifier, but also the motion controller. The motion controller according to the embodiment of the present invention not only sends the command from the host computer to the servo amplifier, but also calculates the position of the mounting head 6, the speed of the mounting head 6, and the acceleration of the mounting head 6 based on the position information from the linear encoder E. Note that the motion controller calculates the speed by differentiating the position information from the linear encoder E and the acceleration by differentiating the speed.

The motion controller calculates the position, speed, and acceleration of the mounting head 6 each time the mounting head 6 moves to thereby monitor the position, speed, and acceleration of the mounting head 6. The foregoing operation is the same for the motion controller controlling the second head H2 on the left side in FIG. 4 and the motion controller controlling the first head H1 on the right side in FIG. 4. The motion controller on the left side in FIG. 4 and the motion controller on the right side in FIG. 4 exchange and share the information on the position, speed, and acceleration of each mounting head 6 at all times. The exchange of information between the motion controllers is carried out at high speed of about 100 μsec. The exchange of, for example, position information between the motion controller on the left side in FIG. 4 and the motion controller on the right side in FIG. 4 is performed via an electric connection including wiring. The arrangement is not, however, limited to the foregoing and data exchange may be performed by using radio waves.

Figure 5:
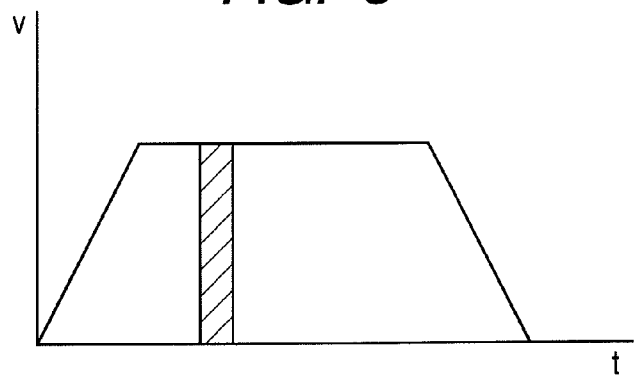
FIG. 5 is typical command data that moves the mounting head.

FIG. 5 is typical command data with which the host computer moves the mounting head 6. FIG. 5 is an example, in which the mounting head 6 in a stationary state is moved to, and stopped at, a specific position. Referring to FIG. 5, acceleration is applied to the stationary mounting head 6 until a predetermined speed is reached. The mounting head 6 is then moved at the predetermined speed and then acceleration in an opposite direction is applied thereto to bring the mounting head 6 to a stop. The area of the trapezoid shown in FIG. 5 represents the distance traveled by the mounting head 6.

The problem is that, while one mounting head 6 is moving, the other mounting head 6 may collide. The program incorporated in the host computer is prepared so that the two mounting heads 6 will not collide. Because of a program bug or noise trapped in wires, however, the mounting head 6 may not operate as desired, resulting in collision. If the two mounting heads 6 collide, the mounting heads 6 can be broken, resulting in serious damage.

To move the mounting head 6 over the distance corresponding to the area of the trapezoid shown in FIG. 5 based on the command from the host computer, the motion controller sends a strip of movement data with a width Δt indicated by a crosshatched area in FIG. 5 to the servo amplifier. The servo amplifier sends the strip of movement data with the width Δt to the linear motor M to thereby move the mounting head 6. The linear encoder E mounted on the x-beam and the y-beam sends the position information of the mounting head 6 to not only the servo amplifier, but also the motion controller, each time the mounting head 6 moves.

The motion controller can therefore have the information on the position, speed, and acceleration of the mounting head 6 at every Δt time interval. The motion controllers on the left and right sides of FIG. 4 have the similar function. The motion controllers on the left and right sides of FIG. 4 exchange the information on the position, speed, and acceleration of the corresponding mounting head 6 at every Δt time interval, so that the two motion controllers share the data.

Given the information on the position, speed, and acceleration of the mounting head 6, a specific position to which the mounting head 6 moves next may be known. The motion controller shares information on, for example, the position of the two mounting heads 6 and is thus capable of determining at all times whether or not the two mounting heads 6 collide through calculation. This is the interference check function of the motion controller shown in FIG. 4.

When it is calculated that the two mounting heads 6 will collide through this interference check function, the motion controller applies brake to the servo amplifier to stop the mounting head 6, thereby avoiding collision, regardless of the command from the host computer.

Figure 6:
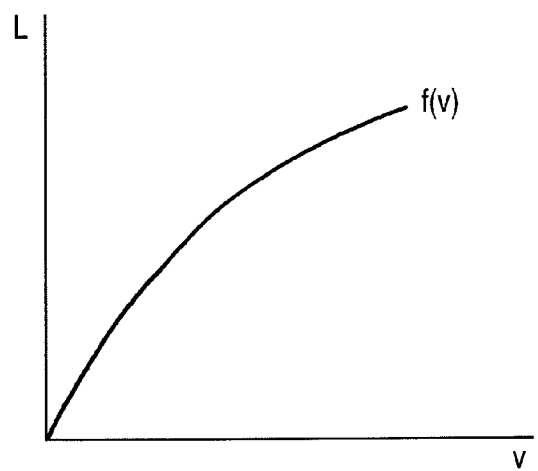
FIG. 6 is a graph showing a braking function.

Even when the motion controller determines that the two mounting heads 6 will collide and applies the brake to the mounting heads 6, the mounting heads 6 cannot be brought to an immediate stop. The speed, which has developed, when the stop command is issued determines the distance that will be traveled by the mounting head 6 after the stop command is issued. FIG. 6 shows a relationship between the above-described speed and the above-described distance. In FIG. 6, an abscissa v represents the speed of the mounting head 6 and an ordinate L represents the distance to be traveled by the mounting head 6 after the stop command is issued. FIG. 6 shows that the higher the speed of the mounting head 6, the greater the distance L traveled by the mounting head 6 before stopping.

Referring to FIG. 6, f(v) is called a braking function. The braking function f(v) is a function that is defined by the system, including characteristics of acceleration for braking, servo system, and the linear motor M, and weight of the mounting head. Having a graph of the braking function as shown in FIG. 6 allows the motion controller to refer to the graph to calculate the position at which the mounting head 6 stops.

Each of the motion controllers calculates the position at which the corresponding one of the mounting heads 6 stops. At the same time, each of the motion controllers can identify the position at which the other mounting head 6 stops. Specifically, each of the motion controllers shares at all times the information on the stop positions at which the two mounting heads 6 stop, respectively.

Figure 7:
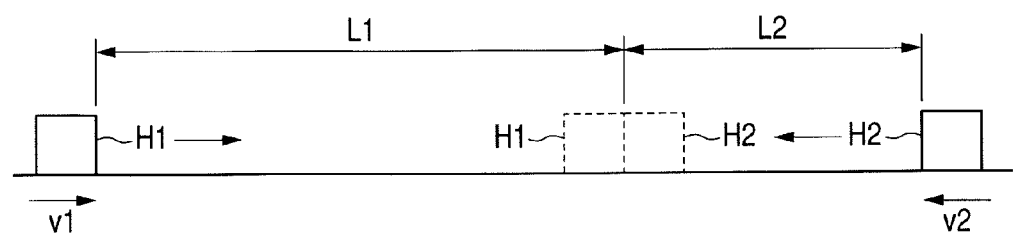
FIG. 7 shows a difference in distance traveled by the two mounting heads before the mounting heads are brought to a stop when the two mounting heads are braked and when the two mounting heads travel at different speeds from each other.

When the calculation result shows that the two mounting heads 6 will collide, the motion controller immediately applies brake to the corresponding one of the two mounting heads 6. FIG. 7 shows an example of braking. Referring to FIG. 7, the first head H1 travels at a speed of v1 and the second head H2 travels at a speed of v2 before the brake is applied. Since v1 is greater than v2, a distance L1 over which the first head H1 travels before stopping is greater than a distance L2 over which the second head H2 travels before stopping. Each motion controller determines the necessity of braking at all times by using the position information including speed of the two mounting heads 6.

Spacing between the two mounting heads 6 should preferably be greater to avoid collision. Keeping a large spacing between the two mounting heads 6 at all times, however, reduces the degree of freedom of movement of the two mounting heads 6, which decreases the electronic component mounting speed. Preferably, therefore, the degree of freedom of movement should be ensured for each mounting head 6 up to a limit within which collision is avoidable. In FIG. 7, each of the distances L1 and L2 represents a distance traveled by the corresponding one of the two mounting heads 6 before contact.

Specifically, the motion controller calculates and identifies the position information including the speed of the two mounting heads 6 at all times. In the case where the two mounting heads 6 move in directions of mutually approaching each other on the same straight line as shown in FIG. 7, when the motion controller determines that the current spacing between the two mounting heads 6 equals to, or less than, the sum of the distances L1 and L2 calculated, the motion controller brakes each mounting head 6 to a stop.

First Embodiment

Figure 8:
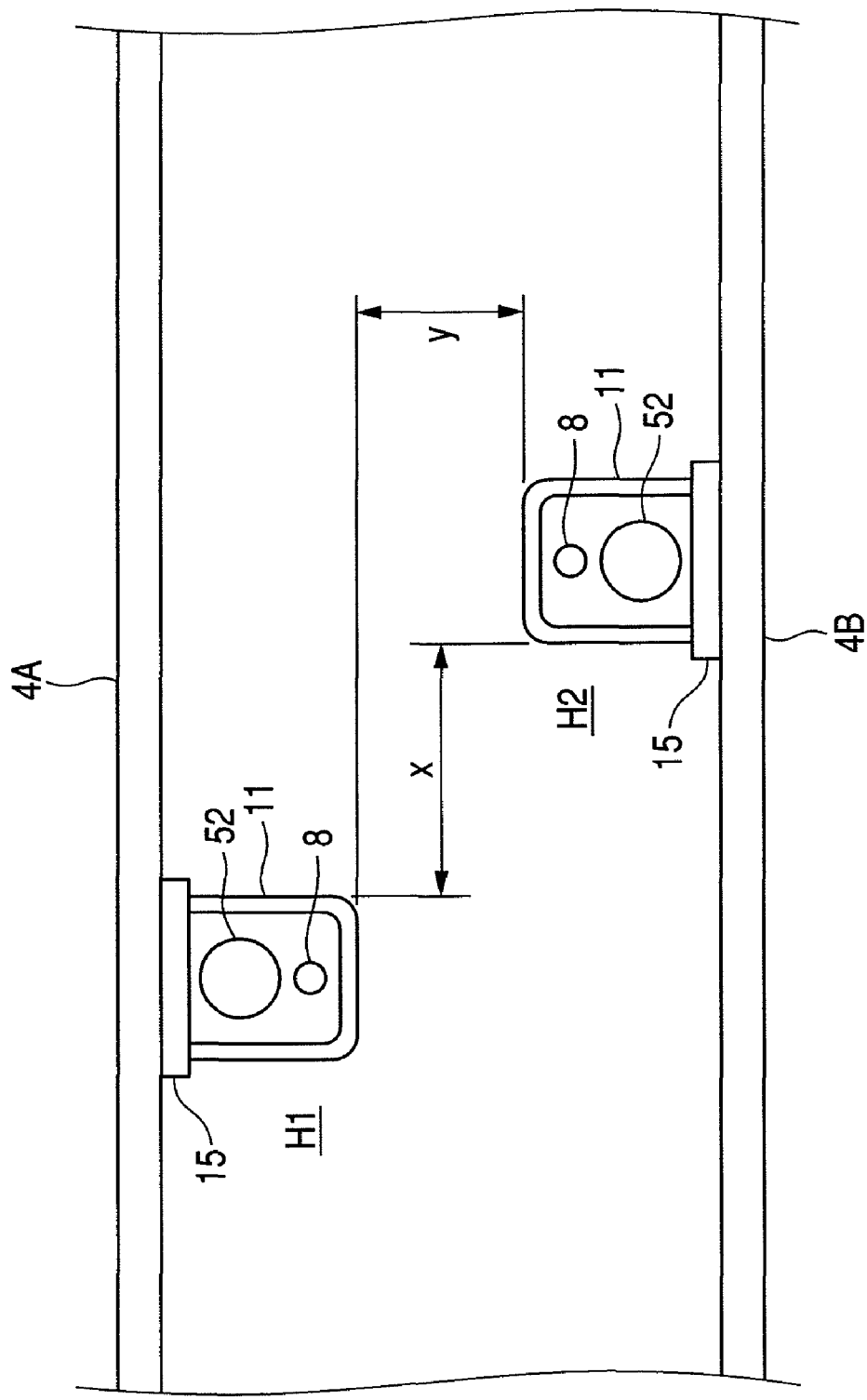
FIG. 8 shows the shape and layout of the heads according to the first embodiment of the present invention.

FIG. 8 is a schematic diagram for evaluating a specific spacing to be ensured between two mutually approaching mounting heads 6 that can avoid collision between the two mounting heads 6. For clarity purpose, the two mounting heads are identified with a first head H1 and a second head H2 in FIG. 8. In FIG. 8, each of the two mounting heads 6 is substantially a rectangle in a plan view. To determine, with such mounting heads 6, whether the two mounting heads 6 collide, it is necessary to evaluate the spacing in the x-direction or the y-direction, and the distance to be traveled by each of the two mounting heads 6 before stopping.

Referring to FIG. 8, each mounting head 6 is mounted on an x-beam via an x-movable element 15. Each mounting head 6 includes such parts as suction nozzles 5 for picking up electronic components, a drive mechanism including a nozzle rotation motor 52, and a board recognition camera 8. In addition, a bumper 11 is formed around an outer periphery of the mounting head 6 for protection of the two mounting heads 6 from collision during servicing or other maintenance procedures.

Figure 9:
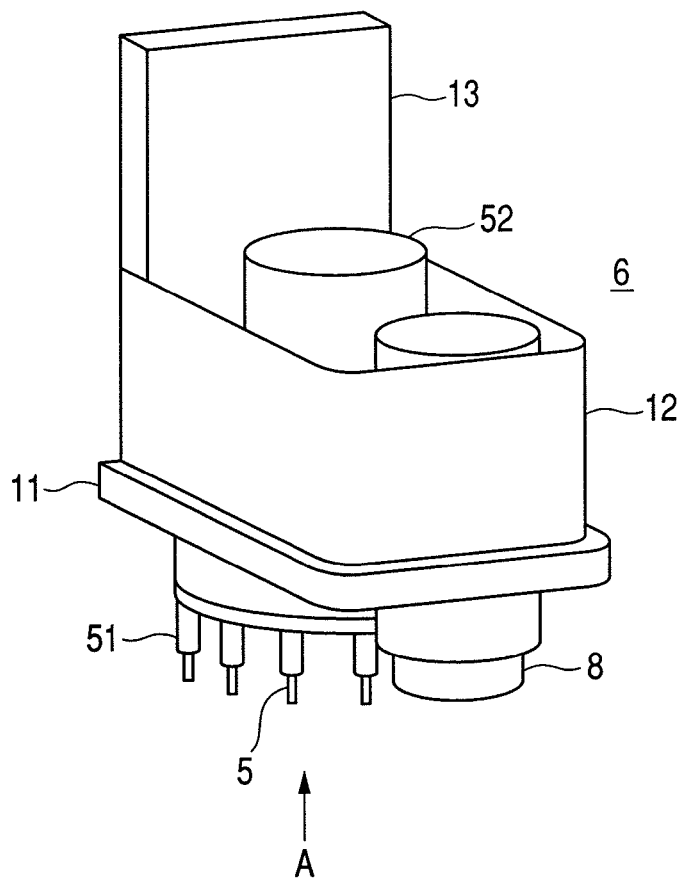
FIG. 9 is a perspective view showing the mounting head.

FIG. 9 is a perspective view showing schematically the mounting head 6. Referring to FIG. 9, the suction nozzles 5 for picking up the electronic components are disposed circumferentially at a lower portion of the mounting head 6. To allow each suction nozzle 5 to pick up the electronic component, it is necessary to evacuate the nozzle to create a vacuum thereinside. To achieve this purpose, each suction nozzle 5 includes a cylinder 51 disposed thereon for controlling the pickup operation performed by the suction nozzle 5.

FIG. 10 shows the suction nozzles 5 as viewed from a direction A of FIG. 9. Referring to FIG. 10, there are a total of twelve suction nozzles 5 arranged circumferentially. The suction nozzles 5 disposed circumferentially become larger in size when the electronic components to be handled become larger in size, so that a decreased number of suction nozzles 5 are disposed. The type of the suction nozzles 5 may be changed depending on the type of a printed board P on which the electronic components are mounted.

It is necessary that a target electronic component be picked up by a corresponding suction nozzle 5. The nozzle rotation motor 52 moves the suction nozzles 5 circumferentially as shown by θ in FIG. 10 to set up the corresponding suction nozzle 5 at a position above the target electronic component. The corresponding suction nozzle 5 is thereafter lowered by the nozzle selection cylinder 51 and picks up the target electronic component. The suction nozzle 5, after having picked up the target electronic component, is raised. The same operation is performed for all 12 suction nozzles 5. Accordingly, a total of twelve electronic components are picked up when the mounting head 6 is moved once to a component feeding unit 3B.

Referring to FIG. 9, the board recognition camera 8 is disposed forward of the suction nozzles 5. The board recognition camera 8 detects the fiducial position on the printed board P when the mounting head 6 moves over to a point above the printed board P. The mounting position of each electronic component on the printed board P is defined with reference to the fiducial position on the printed board P.

When the mounting head 6 moves to a corresponding position on the printed board P, the suction nozzle 5 that has picked up the target electronic component is moved circumferentially to the corresponding position on the printed board P. The suction nozzle 5 is thereafter lowered to thereby mount the target electronic component at the corresponding position on the printed board P.

Referring to FIG. 9, the suction nozzles 5, the nozzle selection cylinders 51, the board recognition camera 8, and other parts are covered in a head cover 12. The head cover 12 is a simple cover that does not achieve an effect of protecting parts thereinside from external impact. Specifically, if the mounting heads 6 in the covers collide, the drive mechanism of the suction nozzles 5, the board recognition camera 8, and other parts may be damaged.

Referring to FIG. 9, the bumper 11 is disposed on the outside of the head cover 12 to protect the suction nozzle drive mechanism, the board recognition camera 8, and other parts inside the head cover 12 during collision between head covers 12. To give the bumper 11 a protection function, the bumper 11 needs to have a certain level of strength. The mounting head 6, on the other hand, needs to move at high speed of about 2 m/sec. If the bumper 11 is heavy, it becomes difficult to move the mounting head 6 at high speed. These considerations must be taken into account when determining the shape, material, and other properties of the bumper 11. In accordance with the first embodiment of the present invention, urethane resin is used for the bumper 11.

Figure 11:
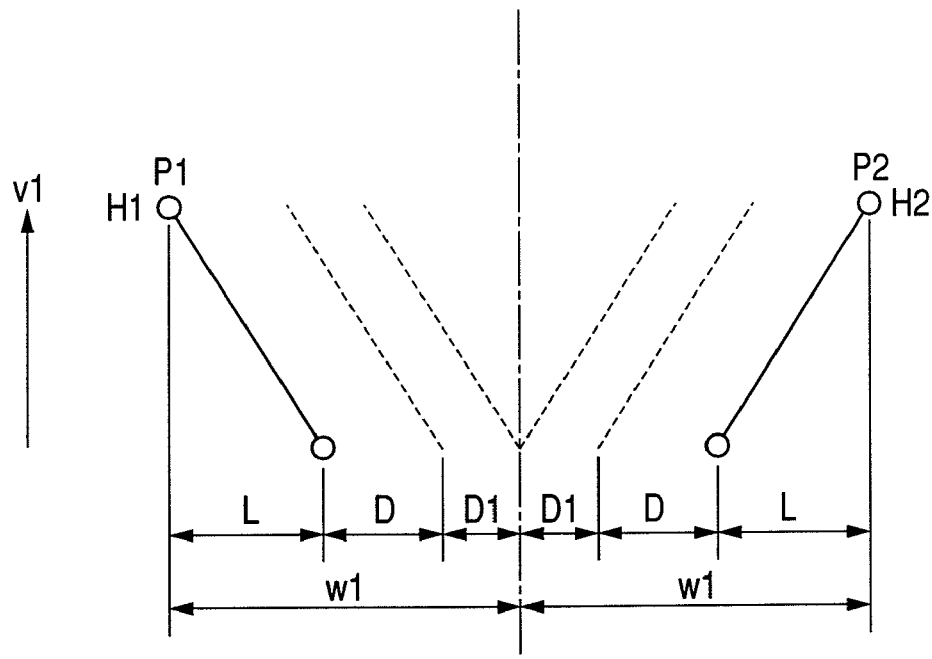
FIG. 11 shows an example indicating the distance covered by the mounting head before being stopped, taking into account the effects of braking function and operation time and speed error.

FIG. 11 is a schematic diagram for evaluating a specific position at which to apply the brake in order to avoid collision when the two mounting heads 6 mutually approach each other head-on along an x-axis or a y-axis. Referring to FIG. 11, the first head H1 approaches the second head H2 at a speed of 2 m/sec, and the second head H2 approaches the first head H1 at a speed of 2 m/sec.

The movement of the first head H1 will first be evaluated. Assume that the first head H1 approaches the second head H2 at a speed of, for example, 2 m/sec. at P1 in FIG. 11. The motion controller then determines that the first head H1 will collide with the head cover 12 and applies brake to the second head H2 at an acceleration of 3 G. The distance to be moved by the first head H1 after the first head H1 is braked is determined by the motion controller using the braking function shown in FIG. 6. In accordance with the first embodiment of the present invention, a distance L moved by the mounting head 6 before being stopped after the breaking is 68 mm. The acceleration of 3 G is the braking acceleration according to the first embodiment of the present invention and it is to be understood that the braking acceleration is not necessarily limited to 3G.

It takes about 2 msec. for the motion controller to evaluate the position, speed, and other parameters of the first head H1, perform an arithmetic operation for the similar information of the second head H2, and actually apply the brake. Then, the first head H1 moves at 2 m/sec. during this period and a distance D moved during the arithmetic operation is: 2 m/sec.×2 msec.=4 mm. Further, there is an error of about 5% in the travel speed and an allowance D1 required for the error is: 4 mm×0.05=0.2 mm.

Assume, on the other hand, that the second head H2 also approaches the first head H1 at a speed of 2 m/sec. at P2 in FIG. 11. Then, a command is issued to make the motion controller apply brake to the second head H2. In the same manner as with the first head H1, the second head H2 also moves a given distance before being stopped after the braking. Specifically, to ensure that the first head H1 and the second head H2 do not collide, the first head H1 must be braked at a position that is W1=L+D+D1; specifically, 68 mm+4 mm+0.2 mm=72.2 mm from the stop position of the first head H1. Similarly, the second head H2 must be braked at a position that is W1=L+D+D1; specifically, 68 mm+4 mm+0.2 mm=72.2 mm from the stop position of the second head H2.

Figure 12:
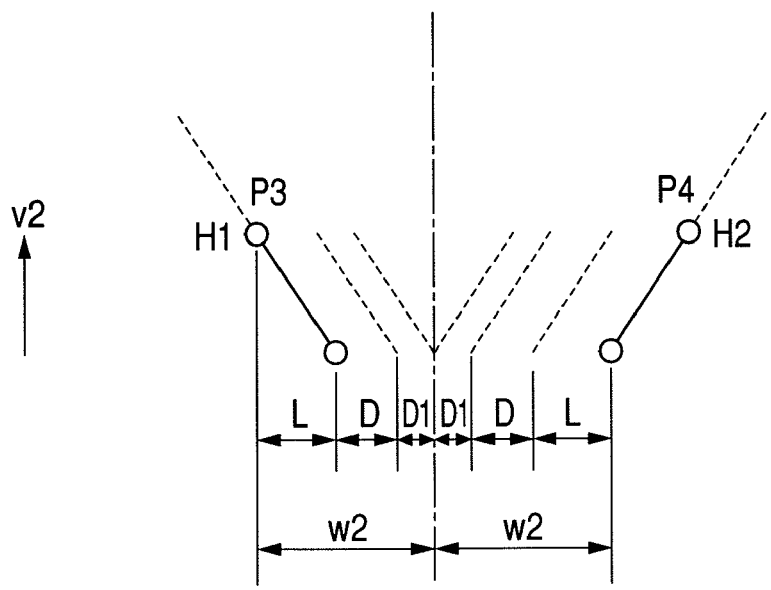
FIG. 12 shows another example indicating the distance covered by the mounting head before being stopped, taking into account the effects of braking function and operation time and speed error.

Referring to FIG. 12, assume that the first head H1 moves toward the side of the second head H2 at a speed v2 of, for example, 1 m/sec. at P3. In this case, the speed of the first head H1 is half of that in FIG. 11, which results in a smaller distance L to a stop. How much smaller the distance L is complies with the braking function. Time required for the arithmetic operation is the same as in the case of FIG. 11 and the distance D moved by the first head H1 during the arithmetic operation is half of that in the case of FIG. 11, specifically, for example, 2 mm. In addition, the distance required associated with the travel speed is half of that in the case of FIG. 11, specifically, 0.1 mm. Assuming that the braking function is linear, L in FIG. 12 is half of that in FIG. 11. This situation also holds true with the second head H2 at position P4 of FIG. 12. Consequently, the position at which to apply brake in order to avoid collision in the case of FIG. 12 is a position W2 from the position at which the two mounting heads 6 contact. The position W2 is half of the position W1 in FIG. 11, specifically, 36.1 mm.

Figure 13:
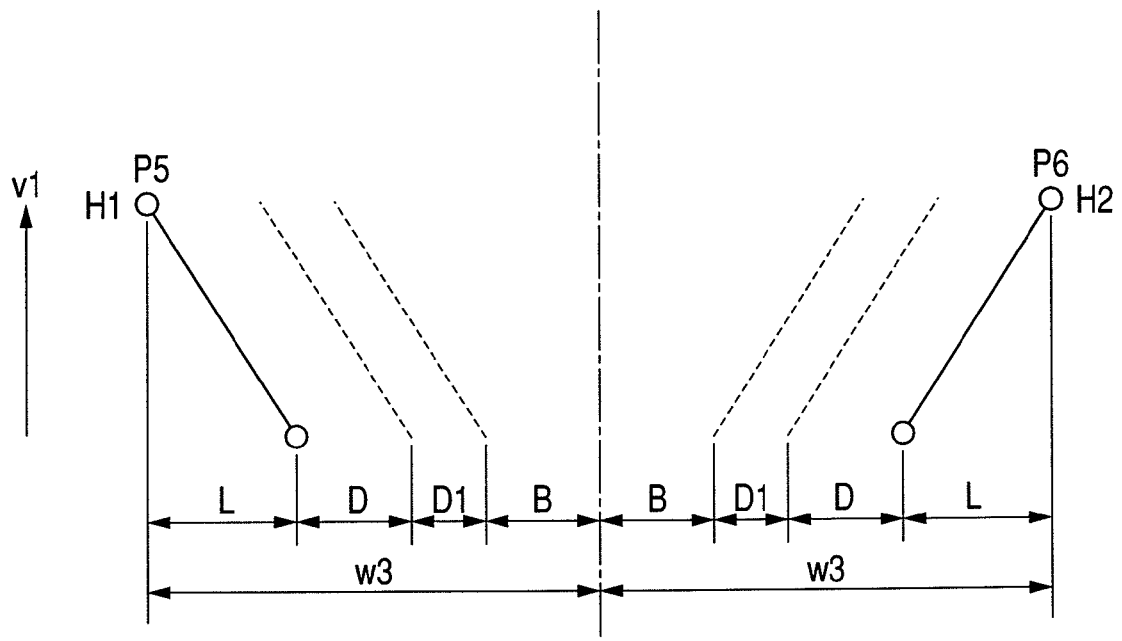
FIG. 13 shows still another example indicating the distance covered by the mounting head before being stopped, taking into account the effects of braking function and operation time and speed error.

The foregoing evaluation assumes that an outline of the mounting head 6 includes the bumper 11. To calculate the brake application position on the assumption that the outline of the mounting head 6 does not include the bumper 11, it becomes necessary to add a wall thickness B of the bumper 11 to the mounting head 6. FIG. 13 assumes that the outline of the mounting head 6 equals the outline of the head cover 12 and evaluates a specific point at which to apply the brake in order to avoid collision.

Referring to FIG. 13, the first head H1 moves toward the second head H2. A position P5 is where the motion controller determines that the first head H1 will collide with the second head H2 and applies the brake. The position at which to apply the brake distances W3 from a position at which the bumper 11 of each of the two mounting heads 6 contacts with each other. The distance W3 is the distance W1 of FIG. 11 plus the thickness of the bumper 11. The same holds true with the second head H2. Specifically, there is no substantial difference between the example shown in FIG. 11 and that shown in FIG. 13, except that, in the example shown in FIG. 13, the bumper 11 is regarded as an element separate from the mounting head 6.

Figure 14:
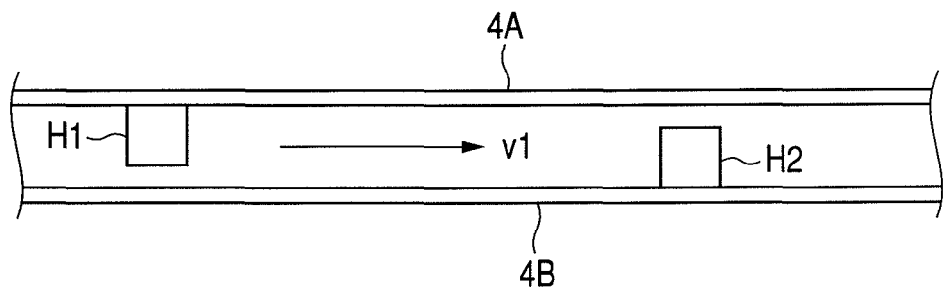
FIG. 14 shows an example of one head colliding with another.
Figure 15:
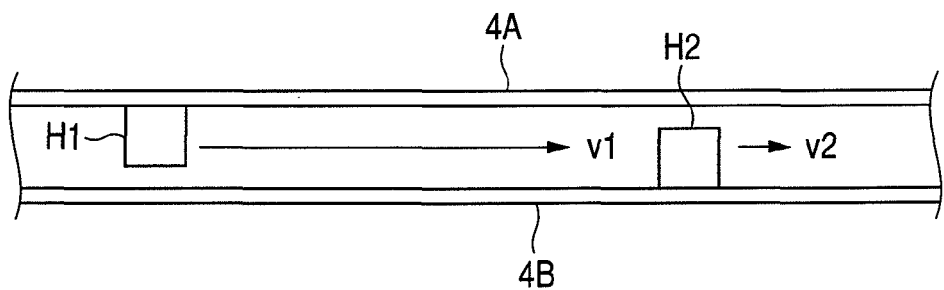
FIG. 15 shows another example of one head colliding with another.

FIG. 14 shows an example, in which, for example, the second head H2 approaches a stationary first head H1, instead of the first head H1 and the second head H2 mutually approaching each other. FIG. 15 shows an example, in which the second head H2 moves away from the first head H1, but the first head H1 approaches the second head H2 at a speed faster than the second head H2. In both examples shown in FIGS. 14 and 15, the first head H1 collides with the second head H2.

Figure 16:
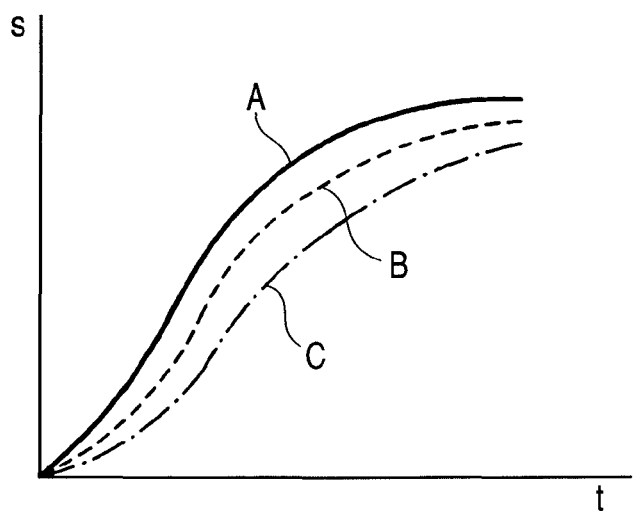
FIG. 16 is a graph showing a relationship of position data in each of elements of the system.

In these cases, preferably the colliding first head H1 is braked earlier than the second head H2 in order to avoid collision even more safely. FIG. 16 shows a relationship of time over which the same position information is transmitted to each of different stages. Referring to FIG. 16, an abscissa t represents time and an ordinate S represents position information. A curve "A" represents the position information which the motion controller outputs to the servo amplifier. A curve "B" represents the position information which the servo amplifier transmits to the linear motor M. A curve "C" represents the position information transmitted from the linear encoder E mounted on the mounting head 6. FIG. 16 shows that the command A from the motion controller is the fastest, while the position information from the linear encoder E is the slowest.

In the examples shown in FIGS. 14 and 15, the motion controller identifies a mounting head 6 to collide with the other and a mounting head 6 to be collided by the other and controls the mounting head 6 to collide based on the curve "A" that is the fastest of all shown in FIG. 16; the motion controller further controls the mounting head 6 to be collided by using the position information from the linear encoder E. Probability of collision can thereby be reduced even further.

Second Embodiment

Figure 17:
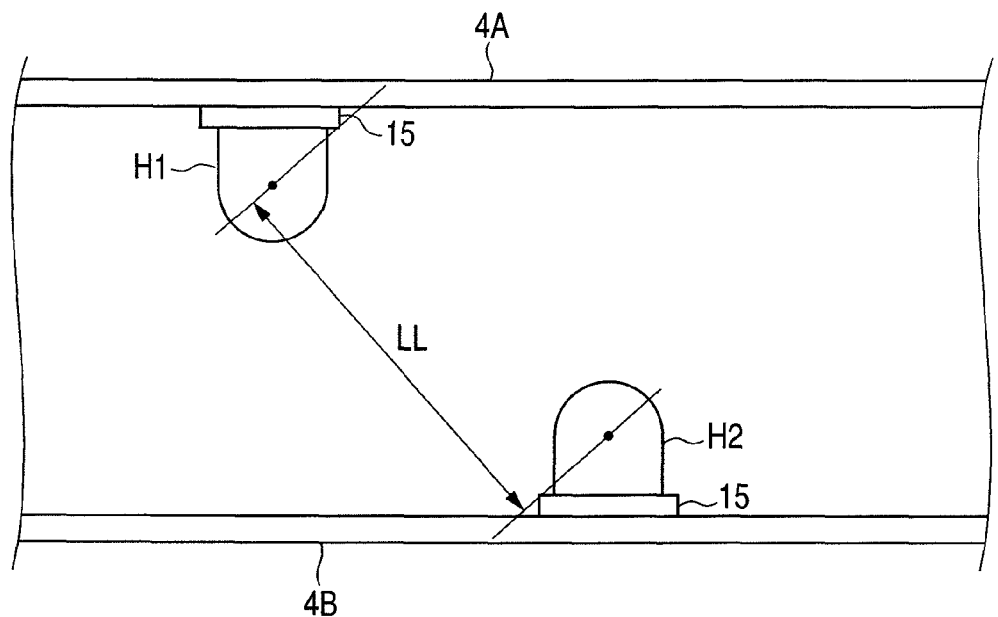
FIG. 17 shows the shape and layout of heads according to a second embodiment of the present invention.

FIG. 17 is a plan view showing an arrangement of a second embodiment of the present invention. For clarity purpose, the two mounting heads are identified with a first head H1 and a second head H2 in FIG. 17. FIG. 17 is a schematic view for evaluating a specific spacing between the two mounting heads 6 for avoiding collision between the two when the two approach each other. The second embodiment of the present invention shown in FIG. 17 differs from the first embodiment of the present invention shown in FIG. 8 in the shape of the mounting head 6 in the plan view. Specifically, the mounting head 6 according to the second embodiment of the present invention shown in FIG. 17 has a semi-circular leading end shape in the plan view, as compared with the mounting head 6 according to the first embodiment of the present invention shown in FIG. 8 having a substantially rectangular shape in the plan view. With the shape of the mounting head 6 as shown in FIG. 17, the spacing between the two mounting heads 6 for avoiding collision is better evaluated with the direct distance between the two mounting heads 6, instead of evaluating dimensions independently in the x-direction and the y-direction. In accordance with the second embodiment of the present invention, it is first necessary to convert x/y information into a distance LL between the two mounting heads 6. With the mounting head 6 having the semi-circular leading end in the plan view as that shown in FIG. 17, the degree of freedom in movement of the first head H1 and the second head H2 can be provided even more largely, by converting the spacing into the LL value.

Figure 18:
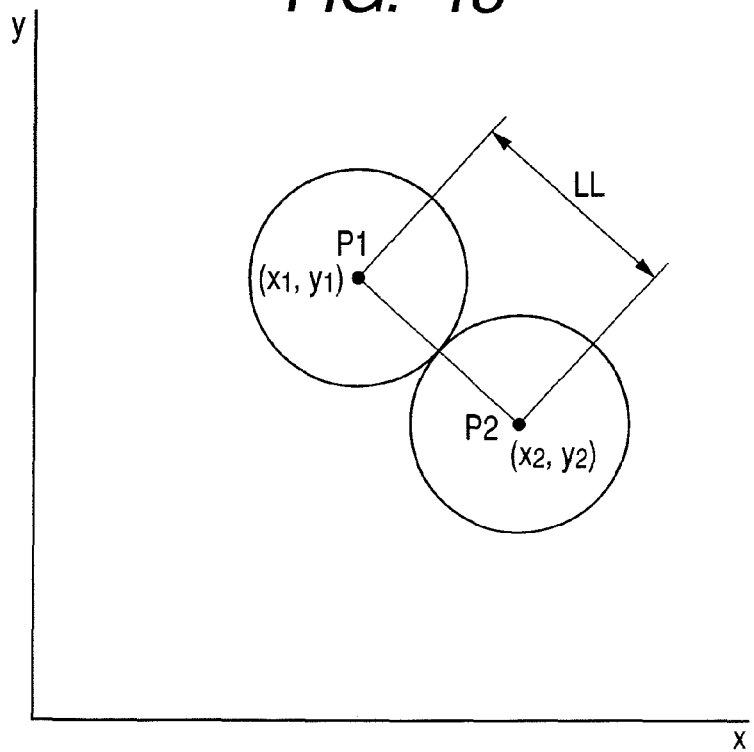
FIG. 18 is a chart for evaluating the distance between the two heads.

FIG. 18 shows a case, in which the first head H1 is located at a position P1 (x1, y1) and the second head H2 is located at a position P2 (x2, y2). The center-to-center distance between the first head H1 and the second head H2 is LL. The speed of the first head H1 at the position P1 is (Vx1, Vy1) and the speed of the second head H2 at the position P2 is (Vx2, Vy2). Determining that the two mounting heads 6 collide, the motion controller applies the brake. Assume, in this case, that the both the motion controller for the first head H1 and the motion controller for the second head H2 issue a braking command.

Let f(V) be the braking function of this system. Let P3 be the position of the first head H1 after the brake is applied. When the x-coordinate of P3 is x3, then x3=x1+f(Vx1). When the y-coordinate of P3 is y3, then y3=y1+f(Vy1). Further, let P4 be the position of the second head H2 after the brake is applied. When the x-coordinate of P4 is x4, then x4=x2+f (Vx2). When the y-coordinate of P4 is y4, then y4=y2+f (Vy2).

Suppose that the first head H1 and the second head H2 are brought to a stop in contact with each other after the brake is applied. The center-to-center distance between the first head H1 and the second head H2 in this case is expressed by (Equation 1).

$$2DD=\sqrt{(x3-x4)_2+(y3-y4)_2}$$ (Equation 1)

Let DD be the distance between the center of the mounting head 6 and an outer end portion of the mounting head 6. The value of 2DD in (Equation 1) is the center-to-center distance between the heads. Then, the range over which the first head H1 or the second head H2 can move after the braking is WW=(LL−2DD)/2. Specifically, the brake must be applied as soon as the first head H1 or the second head H2 reaches a point away by WW from the position at which the first head H1 and the second head H2 contact each other.

Specifically, the motion controller constantly identifies the position information including speed of the two mounting heads 6 and makes sure that the two mounting heads 6 stop at a position not colliding with each other if the brake is applied at this moment. The motion controller applies the brake to the mounting head 6, when it is determined that the two mounting heads 6 will stop at a position of just contact with each other if the brake is applied at this moment. The motion controller may instead apply the brake, when it is determined that the two mounting heads 6 will stop at positions that are a predetermined allowance distance away from each other.

As such, in accordance with the second embodiment of the present invention, the distance between the two mounting heads 6 is controlled through conversion into the direct distance between the two mounting heads 6, instead of evaluating the distance between the two mounting heads 6 in terms of x-coordinate and y-coordinate individually. This allows the two mounting heads 6 to be brought closer together, as compared with the first embodiment of the present invention, so that the degree of freedom in each of the mounting heads 6 can be achieved.

The second embodiment of the present invention has been described for a case, in which the mounting head 6 has the semi-circular leading end shape in the plan view. Advantages of applying the second embodiment of the present invention are also achieved for a mounting head 6 having even a triangular or substantially trapezoidal leading end shape.

In the above-described embodiments of the present invention, the linear motor M moves the mounting head 6 and the linear encoder E detects the position information. If necessary, however, an ordinary rotation motor may be used to move the mounting head 6 and a rotary encoder may be used to detect the position information.

What is claimed is:

1. A mounting apparatus for electronic components, comprising:
   a transport unit for transporting a printed board in a first direction;
   a component supply device disposed on an outside in a second direction that is perpendicular to the first direction relative to the transport unit;
   a first y-beam and a second y-beam that extend in the second direction, the first and second y-beams being spaced apart from each other;
   a first x-beam and a second x-beam that extend in the first direction so as to bridge between the first y-beam and the second y-beam;
   a first mounting head disposed on the first x-beam and a second mounting head disposed on the second x-beam, the first mounting head and the second mounting head for mounting electronic components from the component supply device on the printed board;
   a first encoder disposed on the first y-beam or the second y-beam and the first x-beam, the first encoder for detecting the position of the first mounting head;
   a second encoder disposed on the first y-beam or the second y-beam and the second x-beam, the second encoder for detecting the position of the second mounting head;
   wherein the first mounting head moves based on a command inputted to a first servo amplifier from a host computer via a first motion controller;
   the second mounting head moves based on a command inputted to a second servo amplifier from the host computer via a second motion controller;
   the position information from the first encoder is fed back to the first servo amplifier and the first motion controller;
   the position information from the second encoder is fed back to the second servo amplifier and the second motion controller;
   the first motion controller calculates speed information and acceleration information of the first mounting head based on the position information from the first encoder;
   the second motion controller calculates speed information and acceleration information of the second mounting head based on the position information from the second encoder; and
   the first motion controller and the second motion controller share the position information, the speed information, and the acceleration information of the first mounting head and the position information, the speed information, and the acceleration information of the second mounting head.

2. The mounting apparatus for electronic components according to claim 1, wherein:

the first motion controller and the second motion controller operate the first mounting head or the second mounting head preferentially over the command from the host computer based on the position information or the speed information or the acceleration information of the first mounting head and the position information or the speed information or the acceleration information of the second mounting head.

3. The mounting apparatus for electronic components according to claim 1, wherein:

the operation of the first mounting head or the second mounting head is to avoid collision between the first mounting head and the second mounting head.

4. The mounting apparatus for electronic components according to claim 1, wherein:

the first motion controller and the second motion controller are electrically connected with each other.

5. A mounting apparatus for electronic components, comprising:

a transport unit for transporting a printed board in a first direction;

a component supply device disposed on an outside in a second direction that is perpendicular to the first direction relative to the transport unit;

a first y-beam and a second y-beam that extend in the second direction, the first and second y-beams being spaced apart from each other;

a first x-beam and a second x-beam that extend in the first direction so as to bridge between the first y-beam and the second y-beam;

a first mounting head disposed on the first x-beam and a second mounting head disposed on the second x-beam, the first mounting head and the second mounting head for mounting electronic components from the component supply device on the printed board;

a first encoder disposed on the first y-beam or the second y-beam and the first x-beam, the first encoder for detecting the position of the first mounting head;

a second encoder disposed on the first y-beam or the second y-beam and the second x-beam, the second encoder for detecting the position of the second mounting head;

wherein the first mounting head moves based on a command inputted to a first servo amplifier from a host computer via a first motion controller;

the second mounting head moves based on a command inputted to a second servo amplifier from the host computer via a second motion controller;

the position information from the first encoder is fed back to the first servo amplifier and the first motion controller;

the position information from the second encoder is fed back to the second servo amplifier and the second motion controller; and the first or the second motion controller determines which mounting head, the first or the second, is faster than the other, and establishes an operating condition for the faster mounting head based on the command given to the mounting head and for the slower mounting head based on the position information from the corresponding encoder.

6. The mounting apparatus for electronic components according to claim 5, wherein:

the slower mounting head remains stationary.

7. The mounting apparatus for electronic components according to claim 5, wherein:

the faster mounting head and the slower mounting head move substantially in the same direction.

8. A mounting apparatus for electronic components, comprising:

a transport unit for transporting a printed board in a first direction;

a component supply device disposed on an outside in a second direction that is perpendicular to the first direction relative to the transport unit;

a y-beam that extends in the second direction, and a first x-beam and a second x-beam disposed on the y-beam, the first and the second x-beams extending in the first direction;

a first mounting head disposed on the first x-beam and a second mounting head disposed on the second x-beam, the first mounting head and the second mounting head for mounting electronic components from the component supply device on the printed board;

a first encoder disposed on the y-beam and the first x-beam, the first encoder for detecting the position of the first mounting head;

a second encoder disposed on the y-beam and the second x-beam, the second encoder for detecting the position of the second mounting head;

wherein the first mounting head moves based on a command inputted to a first servo amplifier from a host computer via a first motion controller;

the second mounting head moves based on a command inputted to a second servo amplifier from the host computer via a second motion controller;

the position information from the first encoder is fed back to the first servo amplifier and the first motion controller;

the position information from the second encoder is fed back to the second servo amplifier and the second motion controller;

the first motion controller calculates speed information and acceleration information of the first mounting head based on the position information from the first encoder;

the second motion controller calculates speed information and acceleration information of the second mounting head based on the position information from the second encoder; and the first motion controller and the second motion controller share the position information, the speed information, and the acceleration information of the first mounting head and the position information, the speed information, and the acceleration information of the second mounting head.

\* \* \* \* \*